United States Patent
Harnefors et al.

(10) Patent No.: US 11,239,764 B2
(45) Date of Patent: Feb. 1, 2022

(54) VOLTAGE-SOURCE CONVERTER CONTROL SYSTEM

(71) Applicant: ABB Schweiz AG, Baden (CH)

(72) Inventors: Lennart Harnefors, Västerås (SE); Massimo Bongiorno, Gothenburg (SE); Xiongfei Wang, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/323,456

(22) Filed: May 18, 2021

(65) Prior Publication Data
US 2021/0367529 A1    Nov. 25, 2021

(30) Foreign Application Priority Data
May 25, 2020   (EP) .................................... 20176272

(51) Int. Cl.
*H02M 7/44* (2006.01)
*G05B 13/04* (2006.01)
*H03L 7/08* (2006.01)

(52) U.S. Cl.
CPC ............ *H02M 7/44* (2013.01); *G05B 13/042* (2013.01); *H03L 7/08* (2013.01)

(58) Field of Classification Search
CPC .......... H02M 7/42; H02M 7/44; G05B 13/02; G05B 13/04; G05B 13/042; G05B 13/044; H03L 7/06; H03L 7/08
See application file for complete search history.

(56) References Cited

U.S. PATENT DOCUMENTS

| | | |
|---|---|---|
| 10,170,914 B2 | 1/2019 | Harnefors |
| 2018/0278058 A1 | 9/2018 | Harnefors |

FOREIGN PATENT DOCUMENTS

| | | |
|---|---|---|
| CN | 101141100 A | 3/2008 |
| CN | 102710105 A | 10/2012 |
| EP | 3345277 A1 | 7/2018 |

OTHER PUBLICATIONS

Alawasa, Khaled Mohammad, et al.; "Active Mitigation of Subsynchronous Interactions Between PWM Voltage-Source Converters and Power Networks"; IEEE Transactions on Power Electronics, vol. 29, No. 1; Mar. 8, 2013; 14 Pages.

Alawasa, Khaled Mohammad, et al.; "Modeling, Analysis, and Suppression of the Impact of Full-Scale Wind-Power Converters on Subsynchronous Damping"; IEEE Systems Journal, IEEE, US, vol. 7, No. 4, Dec. 1, 2013; 13 Pages.

(Continued)

*Primary Examiner* — Diana J. Cheng
(74) *Attorney, Agent, or Firm* — Whitmyer IP Group LLC

(57) ABSTRACT

A voltage-source converter, VSC, control system including an active damper, AD, a direct-voltage controller, DVC, and an alternating-voltage controller, AVC. The VSC control system is configured to control a VSC. The AVC is configured to regulate, using an integrator, an ac-bus voltage of the VSC by calculating a q component of a current reference vector for the VSC. The DVC is configured to regulate, using an integrator, a dc-bus voltage of the VSC by calculating a d component of the current reference vector. The AD is configured to amplify a vectoral difference between the ac-bus voltage and a corresponding reference, and to add the q component of the amplified vectoral difference to the q component of the current reference vector and to an input of the integrator of the AVC.

12 Claims, 3 Drawing Sheets

(56) References Cited

OTHER PUBLICATIONS

Wu, Xiaojie, et al.; "Grid Harmonics Suppression Scheme for LCL-Type Grid-Connected Inverters Based on Output Admittance Revision"; IEEE Transactions on Sustainable Energy, IEEE, USA, vol. 6, No. 2; Apr. 1, 2015; 11 Pages.

Liu, Huaiyuan, et al.; "Passivity Based Damping Design for Grid-Connected Converter With Improved Stability"; IEEE Access, vol. 7; Dec. 19, 2019; 11 Pages.

Extended European Search Report; Application No. 20176272.1; dated Nov. 18, 2020; 8 Pages.

VOLTAGE-SOURCE CONVERTER CONTROL SYSTEM

TECHNICAL FIELD

The present disclosure relates to a voltage-source converter control system.

BACKGROUND

A voltage-source converter (VSC), or a cluster of converters—for example in a wind or solar park—may, if the total power rating is high enough, experience an unstable interconnection with a power grid it is connected to. Instability can result even if the grid impedance is resistive-inductive, should the grid be sufficiently weak. The risk for instability increases further if there are sub-synchronous resonances, or super-synchronous resonances close to the fundamental frequency of the power grid.

A block and circuit diagram of a VSC of a line converter is shown in FIG. 1. A current controller (CC) is the core of the control system for the VSC. The CC can be designed so that an input admittance to the CC seen from a point of common coupling (PCC) of the VSC becomes passive. This allows a stable interconnection with any passive grid impedance $Z_g^s(s)$. Four signals are fed into the CC: $i^s$, $v_p^s$, $\theta$, and $i_{ref}$.

A phase-locked loop (PLL) is configured to compute the dq transformation angle $\theta$ from the PCC voltage $v_p^s$, so that the corresponding dq-transformed PCC-voltage vector $v_p$ becomes real valued in steady state.

On the grid side in FIG. 1, $v^s$ is the voltage generated by the VSC, $v_g^s$ is the stiff grid voltage behind the grid impedance, and Le is the converter-filter inductance, which in practice has an inner resistance. Any additional filter branches at the PCC can be modelled by inclusion in the grid impedance.

A direct-voltage controller (DVC) regulates a dc-bus voltage $v_d$ of the VSC by adjusting a reference $i_d^{ref}$, which is the active-power-producing component of $i_{ref}$. A proportional-integral (PI) controller is typically used to achieve this. Signals for Pa and $v_d$ are fed into the DVC.

$P_d$ is the dc-bus load power and Ca is the dc-bus capacitance.

An alternating-voltage controller (AVC) regulates the PCC-voltage magnitude by adjusting a reference $i_q^{ref}$ for the reactive-power-producing component of $i_{ref}$. A pure integral controller is often sufficient to achieve this, but a proportional part may be added if needed.

The PLL, DVC, and AVC however destroy the passivity of the input admittance to the CC. In a region $[0,\omega_x]$ in the dq frame—the so-called negative-conductance region—the input admittance is no longer dissipative.

In principle, the larger $\omega_x$ is, the greater the risk for instability. The purpose of adding an active damper (AD) as an additional outer loop of the control system is to reduce the negative-conductance region and thereby make the VSC control system more robust.

One proposal for an AD is described in "Modeling, Analysis, and Suppression of the Impact of Full-Scale Wind-Power Converters on Subsynchronous Damping"— Alawasa et al. IEEE systems journal, wherein $i_{ref} = i_d^{ref} + j i_q^{ref}$ is set as the current reference vector whose components respectively are set by the DVC and the AVC. The total reference vector is then formed by adding a feedback of the PCC voltage as:

$$i_{ref} = i_{ref}^0 + B(s)v_p \qquad (1)$$

where $B(s)$ ($s=d/dt$) is a bandpass filter. Alternatively, the added term can simply be a proportionality of:

$$i_{ref} = i_{ref}^0 + \underbrace{G_a(v_p - V_{ref})}_{i_D^{ref}} \qquad (2)$$

where $V_{ref}$ is the PCC-voltage reference and $G_a$ may be called the active conductance.

In U.S. Pat. No 10,170,914, the performance of this scheme is shown to deteriorate more and more, as the PLL bandwidth is increased. The AD thus fails one of its purposes, to compensate for the destabilizing impact of the PLL. The solution proposed in U.S. Pat. No. 10,170,914 is to use a slow PLL in the computation of the vector $v_p$ used in the AD. This extends the range of the AD and preserves stability in cases where it otherwise is lost, as shown in U.S. Pat. No. 10,170,914. This solution will however result in undesirable slow transients added to voltages and currents because of the slow PLL. In addition, this solution does not compensate for a similar deterioration effect that is caused by the DVC.

SUMMARY

One objective of the present invention is to compensate the low-frequency deteriorating effect that a phase-locked loop (PLL) has on an active damper (AD) of a voltage-source converter (VSC) control system.

According to a first aspect a VSC control system is presented. The VSC control system comprises an AD, a direct-voltage controller, DVC, and an alternating-voltage controller, AVC. The VSC control system is configured to control a VSC. The AVC is configured to regulate, using an integrator, an ac-bus voltage of the VSC by calculating a q component of a current reference vector for the VSC. The DVC is configured to regulate, using an integrator, a dc-bus voltage of the VSC by calculating a d component of the current reference vector. The AD is configured to amplify a vectoral difference between the ac-bus voltage and a corresponding reference, and to add the q component of the amplified vectoral difference to the q component of the current reference vector and to an input of the integrator of the AVC.

Another object of the present invention may be to compensate the low-frequency deteriorating effect that the DVC has on the AD.

The AD may further be configured to amplify a vectoral difference between the dc-bus voltage and a corresponding reference, and to add the d component of the amplified vectoral difference to the d component of the current reference vector and to an input of the integrator of the DVC. The DVC may be configured to add the d component directly to the output of the DVC and via a gain to the input of the integrator of the DVC. The gain may be set to a closed-loop bandwidth of the DVC. The gain may alternatively be set to underestimate a closed-loop bandwidth of the DVC. The gain may further be set to overestimate a closed-loop bandwidth of the DVC.

The AVC may be configured to add the q component directly to the output of the AVC as well as, via a gain to the input of the integrator of the AVC.

The VSC control system may further comprise a phase locked loop, PLL, configured to regulate an ac-bus voltage of a VSC using the q component of ac-bus-voltage vector as input signal. The gain in the AVC may be set to a closed-loop bandwidth of the PLL. The gain may alternatively set to underestimate a closed-loop bandwidth of the PLL. The gain may further be set to overestimate a closed-loop bandwidth of the PLL. The PLL may further be configured to regulate the ac-bus voltage of a point of common coupling, PCC, of the VSC to a real value at steady state.

The VSC control system compensates for dynamics added by the PLL, and possibly by the DVC, by introducing signal paths into the integrators respectively of the AVC and the DVC. A control system requiring a slow PLL is thus not needed, thereby also preventing undesirable slow transients in the control system.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, byway of example, with reference to the accompanying drawings, in which.

DETAILED DESCRIPTION

The aspects of the present disclosure will now be described more fully hereinafter with reference to the accompanying drawings, in which certain embodiments of the invention are shown.

These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

An active damper (AD) using a slow phase locked loop (PLL) in a voltage-source converter (VSC) control system as proposed in U.S. Ser. No. 10/170,914 has two drawbacks. The slow PLL introduces transients that inherently die down slowly. In addition, a direct-voltage controller (DVC) has a similar impact as the PLL has. Ideally, d and q components of $i_D^{ref}$ in (2) are respectively given by:

$$i_{d,D}^{ref} = G_a(v_{pd} - V_{ref}) \quad i_{q,D}^{ref} = G_a v_{pq} \qquad (3).$$

By analyzing the VSC control system, it can be found that $i_{d,D}^{ref}$ and $i_{q,D}^{ref}$ are affected in a similar way, respectively, by the DVC and the PLL dynamics. The reference components that actually are obtained include a high-pass filtering of (3) as follows:

$$i_d^{ref} = i_d^{ref0} + \frac{s}{s + \alpha_d} G_a(v_{pd} - V_{ref}) \qquad (4)$$

$$i_q^{ref} = i_q^{ref0} + \frac{s}{s + \alpha_p} G_a v_{pd}$$

where $\alpha_d$ and $\alpha_p$, respectively, are the DVC and PLL closed-loop bandwidths and $i_{d,q}^{ref0}$ are the contributions from the DVC and an alternating-voltage controller (AVC). Hence, in the frequency range where compensation is needed, i.e. within $[0,\omega_x]$, the compensation is quenched by an effect that in both the d and q signal paths is manifested approximately as a first-order high-pass filter.

The shortcoming of the reference components for the high-pass filter effect in (4) may be rectified in the following way.

The inverse of the high-pass filters is inserted in the components of AD (3) to compensate as:

$$i_{d,D}^{ref} = \frac{s + \alpha_d}{s} G_a(v_{pd} - V_{ref}) \qquad (5)$$

$$i_{q,D}^{ref} = \frac{s + \alpha_p}{s} G_a v_{pq}$$

wherein the DVC component is $$\frac{s + \alpha_d}{s}$$

and the PLL component is $$\frac{s + \alpha_p}{s}.$$

The inverses are in effect PI controllers, $$1 + \frac{\alpha_d}{s}$$

and $$1 + \frac{\alpha_p}{s},$$

respectively. The compensations thus involve adding an integral (I) signal path in parallel to an already existing proportional (P) signal path. However, inserting additional integrators in the control system is not recommended or even possible, due to the risk for windup. The signals may instead be routed into already existing integrators in the DVC and the AVC, obtaining the structures shown in FIGS. 2 and 3.

Figure 1:
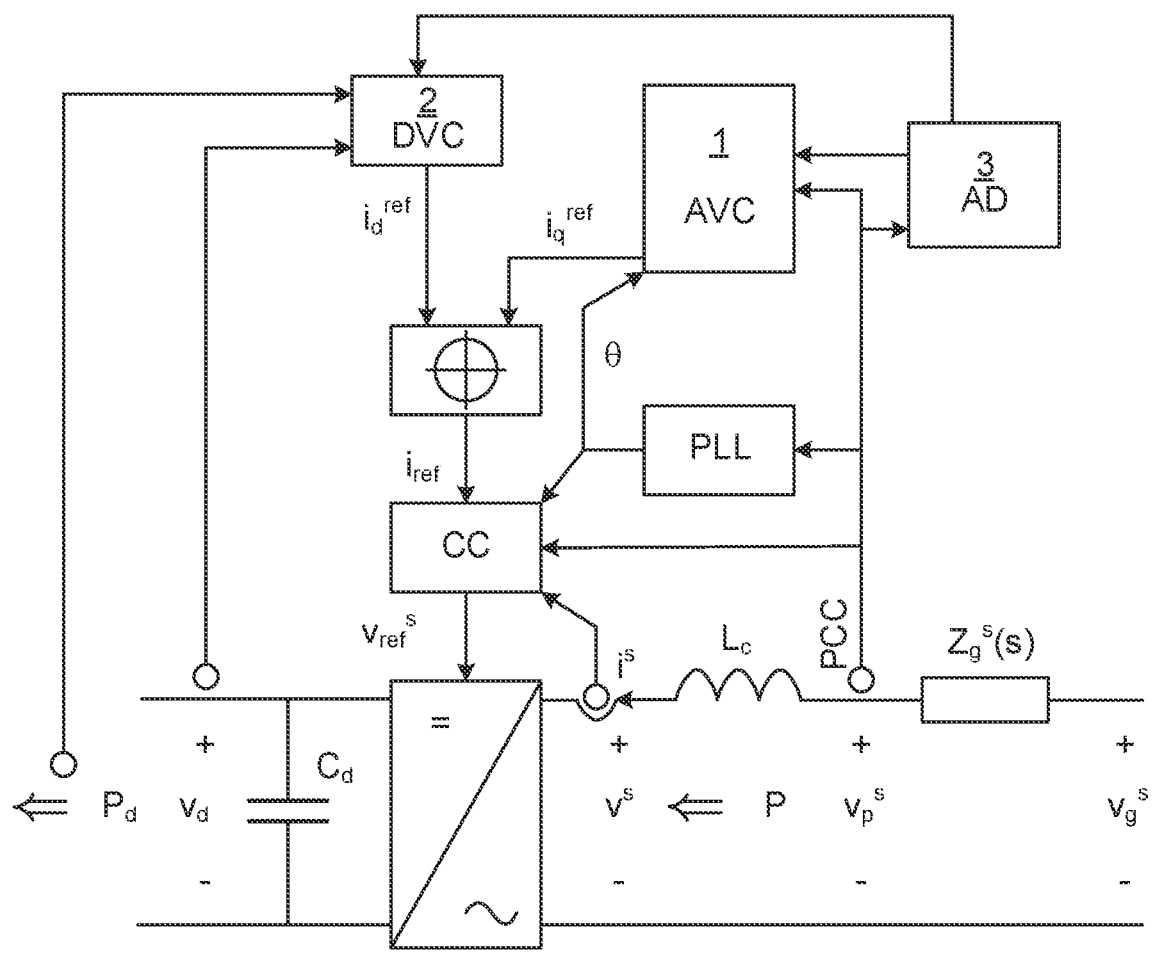
FIG. 1 is a diagram schematically illustrating a circuit and block diagram of a voltage-source converter of a line converter.
Figure 2:
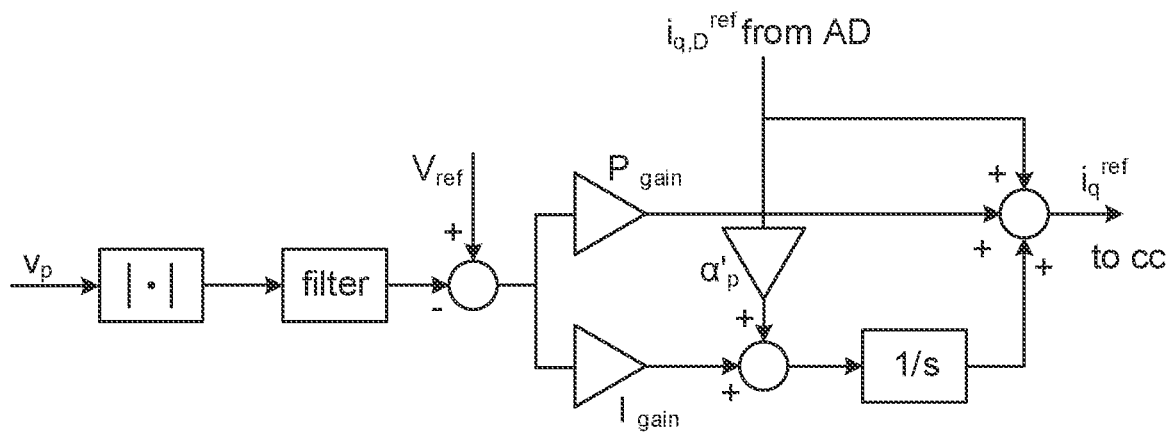
FIG. 2 is a diagram schematically illustrating an embodiment of an AVC with an AD signal path added.

Details of the AVC 1 of FIG. 1 are illustrated in FIG. 2, in which a low-pass filter can be applied to the absolute value of the received PCC-voltage signal $v_p$. The filtered signal is then subtracted from the reference voltage $V_{ref}$ to form an error signal. The error signal is thereafter provided to both the P and I signal paths.

In the I signal path the error signal is initially amplified, and thereafter the imaginary part of the current reference $i_D^{ref}$ from the AD, $i_{q,D}^{ref}$, amplified with $a'_p$, is added to the amplified error, after what the resulting signal is integrated, 1/s.

In the P signal path the error signal is amplified and thereafter the resulting signal from the P signal path, resulting signal from the I signal path, and the imaginary part of the current reference $i_D^{ref}$ from the AD, $i_{q,D}^{ref}$, are all added together to form the imaginary (q) part of the current reference signal to be sent to the CC.

Selecting $\alpha'_p = \alpha_p$, i.e. the PLL closed loop bandwidth, directly compensates the detrimental effect of the PLL, whereas larger and smaller selections respectively give over- and under-compensation.

The reference $V_{ref}$ may be constant or may be determined by a feedback loop, or multiple feedback loops (not shown in the figures).

Figure 3:
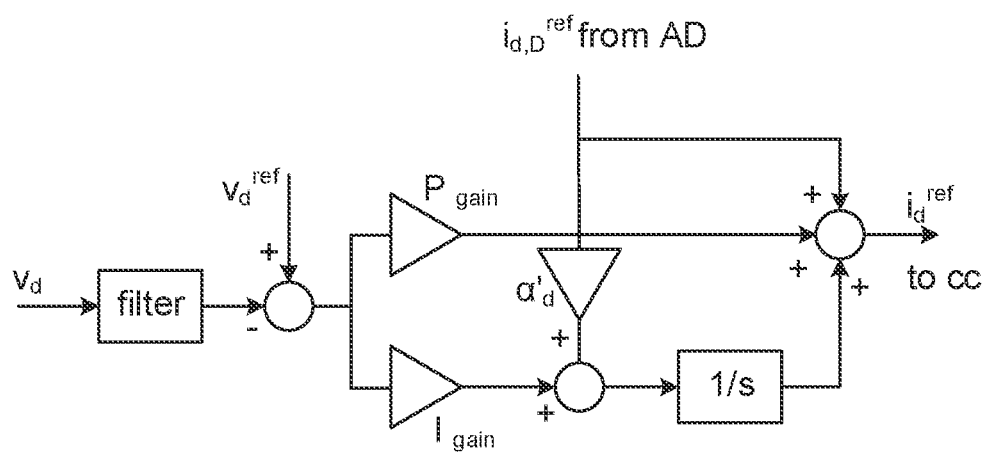
FIG. 3 is a diagram schematically illustrating an embodiment of a DVC with an AD signal path added.

Details of the DVC 2 of FIG. 1 is illustrated in FIG. 3, in which a low-pass filter can be applied to the received dc-bus-voltage signal $v_d$. The filtered signal is then subtracted from the reference voltage $v_d^{ref}$, forming an error signal. The error signal is thereafter provided to both the P and I signal paths.

In the I signal path the error signal is initially amplified, and thereafter the real part of the current reference $i_D^{ref}$ from the AD, $i_{d,D}^{ref}$, amplified with $\alpha'_d$, is added to the amplified error signal, after what the resulting signal is integrated, 1/s.

In the P signal path the error signal is amplified, and thereafter the resulting signal from the P signal path, the resulting signal from the I signal path, and the real part of the current reference iDref from the AD, id,Dref, are all added together to form real (d) part of the current reference signal to be sent to the CC.

Selecting α'd=αd, i.e. the DVC closed loop bandwidth, directly compensates the detrimental effect of the DVC, whereas larger and smaller selections respectively give over- and under-compensation.

According to the present invention, each of the amplified signal paths from the AD to the I path of the AVC and DVC, respectively, improves the stability of the VSC control system.

Figure 4:
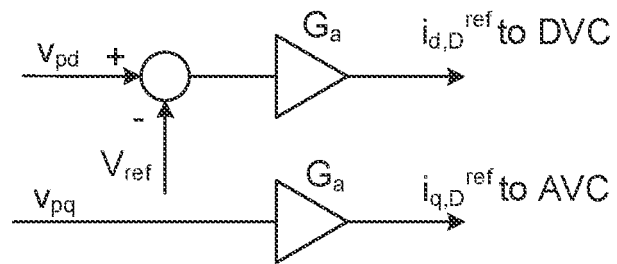
FIG. 4 is a diagram schematically illustrating an example of an AD useful for both the AVC illustrated in FIG. 2 and for the DVC illustrated in FIG. 3.

The AD contribution to the DVC 2 may subtract the reference voltage $V_{ref}$ from the real (d) part of the PCC voltage, $v_{pd}$, as illustrated in FIG. 4. The subtracted signal is then amplified with $G_a$ before the signal is sent to the DVC 2. The AD contribution to the AVC 1 amplifies the imaginary (q) part of the PCC voltage, $v_{pq}$, with $G_a$ before it is sent to the AVC 1. In principle, two different values of $G_a$ can be used in the two signal paths, but it is generally beneficial to use the same value.

Figure 5:
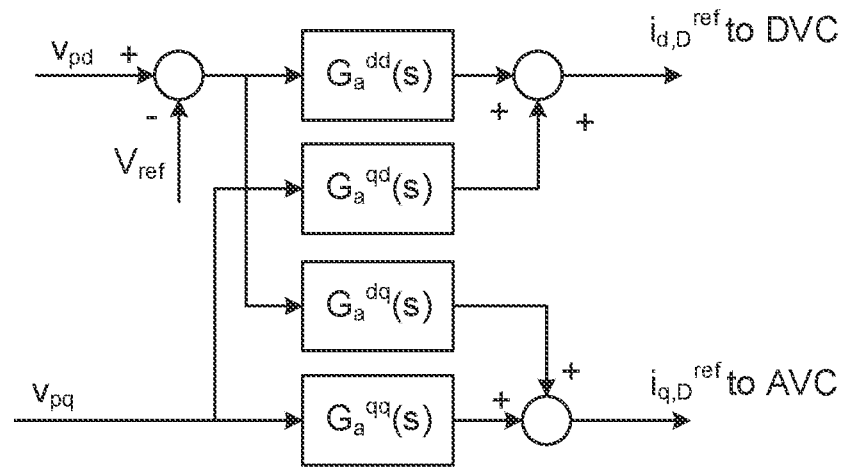
FIG. 5 is a diagram schematically illustrating another example of an AD useful for both the AVC illustrated in FIG. 2 and the DVC illustrated in FIG. 3.

An alternative embodiment of an AD 3 is illustrated in FIG. 5. The same input signals are used as in FIG. 4, but the gains $G_a$ in the d and q signal paths are replaced respectively by the filters $G_a^{dd}(s)$ and $G_a^{qq}(s)$. In addition, cross couplings between the two signal paths are introduced by the filters $G_a^{dq}(s)$ and $G_a^{qd}(s)$. This embodiment is a generalization of FIG. 4, as it reduces to FIG. 4 by letting $G_a^{dd}(s)=G_a^{qq}(s)=G_a$ and $G_a^{dq}(S)=G_a^{qd}(s)=0$.

An AVC connected to a very weak inductive grid with a short-circuit ratio 1.25 seen from the PCC has been simulated with and without the AD presented herein. Current and power direction was into the AVC, wherein the active-power reference was increased (with a lag), i.e. inverter operation. Without AD the system is unstable or, at best, very close to instability. With an uncompensated AD, stability is gained, but the stability margins are low, which is seen as low-frequency ringing. Adding the presented DVC and AVC compensation to the AD significantly improved the stability properties.

An embodiment of a VSC control system comprising an AD 3, a DVC 2, and an AVC 1 is presented with reference to FIGS. 1-5. The VSC control system is configured to control a VSC.

The AVC 1 is configured to regulate, using an integrator 1/s, the magnitude of an ac-bus voltage $v_p^s$ of the VSC by calculating a q component of a current reference vector $i^{ref}$ for the VSC.

The DVC 2 is configured to regulate, using an integrator 1/s, a dc-bus voltage $v_d$ of the VSC by calculating a d component of the current reference vector $i^{ref}$.

The AD 3 is configured to amplify a vectoral difference between the ac-bus voltage and a corresponding reference. The imaginary (q) part of the amplified vectoral difference is added to the q component of the current reference vector and to an input of the integrator of the AVC 1.

The AD may further be configured to amplify a vectoral difference between a dc-bus voltage and a corresponding reference. The real (d) part of the amplified vectoral difference is added to the d component of the current reference vector and to an input of the integrator of the DVC. The d component may be added directly to the output of the DVC and via a gain $\alpha'_d$ to the input of the integrator of the DVC.

The gain $\alpha'_d$ may be set to a closed-loop bandwidth of the DVC.

The gain $\alpha'_d$ may alternatively be set to underestimate or to overestimate a closed-loop bandwidth of the DVC.

The AVC may be configured to add the q component directly to the output of the AVC as well as, via a gain $\alpha'_q$, to the input of the integrator of the AVC.

The VSC control system may further comprise a PLL 3 configured to regulate an ac-bus voltage of a VSC using the q component of the ac-bus-voltage vector as input signal. The PLL may be configured to regulate the ac-bus voltage to a real value at steady state.

The gain $\alpha'_q$ may be set to a closed-loop bandwidth of the PLL.

The gain $\alpha'_q$ may alternatively be set to underestimate or to overestimate a closed-loop bandwidth of the PLL.

The aspects of the present disclosure have mainly been described above with reference to a few embodiments and examples thereof. However, as is readily appreciated by a person skilled in the art, other embodiments than the ones disclosed above are equally possible within the scope of the invention, as defined by the appended patent claims.

The invention claimed is:

1. A voltage-source converter, VSC, control system comprising an active damper, AD, a direct-voltage controller, DVC, and an alternating-voltage controller, AVC, the VSC control system being configured to control a VSC, wherein:
the AVC is configured to regulate, using a first integrator, an ac-bus voltage of the VSC by calculating a q component of a current reference vector for the VSC;
the DVC is configured to regulate, using a second integrator, a dc-bus voltage of the VSC by calculating a d component of the current reference vector;
the AD is configured to amplify a vectoral difference between the ac-bus voltage and a corresponding reference, and to add the q component of the amplified vectoral difference to the q component of the current reference vector and to an input of the first integrator of the AVC.

2. The VSC control system as claimed in claim 1, wherein the AD further is configured to amplify a vectoral difference between the dc-bus voltage and a corresponding reference, and to add the d component of the amplified vectoral difference to the d component of the current reference vector and to an input of the second integrator of the DVC.

3. The VSC control system as claimed in claim 2, wherein the DVC is configured to add the d component directly to the output of the DVC and via a gain to the input of the second integrator of the DVC.

4. The VSC control system as claimed in claim 3, wherein the gain is set to a closed-loop bandwidth of the DVC.

5. The VSC control system as claimed in claim 3, wherein the gain is set to underestimate a closed-loop bandwidth of the DVC.

6. The VSC control system as claimed in claim 3, wherein the gain is set to overestimate a closed-loop bandwidth of the DVC.

7. The VSC control system as claimed in claim 1, wherein the AVC is configured to add the q component directly to the output of the AVC as well as, via a gain, to the input of the first integrator of the AVC.

8. The VSC control system as claimed in claim 1, further comprising a phase locked loop, PLL, configured to regulate an ac-bus voltage of a VSC using the q component of ac-bus-voltage vector as input signal.

9. The VSC control system as claimed in claim 8, wherein the gain is set to a closed-loop bandwidth of the PLL.

10. The VSC control system as claimed in claim 8, wherein the gain is set to underestimate a closed-loop bandwidth of the PLL.

11. The VSC control system as claimed in claim 8, wherein the gain is set to overestimate a closed-loop bandwidth of the PLL.

12. The VSC control system as claimed in claim 8, wherein the PLL is configured to regulate the ac-bus voltage of a point of common coupling, PCC, of the VSC to a real value at steady state.

* * * * *